United States Patent [19]
Forsberg

[11] Patent Number: 6,049,175
[45] Date of Patent: Apr. 11, 2000

[54] ARRANGEMENTS RELATING TO LIGHT EMITTING DEVICES

[75] Inventor: Gunnar Forsberg, Ljusstöparebacken, Sweden

[73] Assignee: Telefonaktiebolaget LM Ericsson, Stockholm, Sweden

[21] Appl. No.: 08/969,850

[22] Filed: Nov. 14, 1997

[51] Int. Cl.$^7$ .................................. H01S 3/00; H04B 9/00
[52] U.S. Cl. .............................. 315/200 A; 315/209 CD; 315/241 P; 372/38
[58] Field of Search .................... 315/141, 241 S, 315/241 P, 200 A, 207, 308, 209 CD, 209 R, 151; 372/38

[56] References Cited

U.S. PATENT DOCUMENTS

| | | | |
|---|---|---|---|
| 3,887,836 | 6/1975 | Leete | 315/207 |
| 4,295,226 | 10/1981 | Dombrowski | 455/618 |
| 4,571,506 | 2/1986 | Lisco | 307/311 |
| 4,701,672 | 10/1987 | Sikora | 315/241 S |
| 4,723,312 | 2/1988 | Yamashita et al. | 455/613 |
| 4,818,896 | 4/1989 | Cavanna | 307/362 |
| 5,508,623 | 4/1996 | Heydt et al. | 324/623 |

FOREIGN PATENT DOCUMENTS

| | | |
|---|---|---|
| 0 441 965 | 8/1991 | European Pat. Off. . |
| 0 470 780 | 2/1997 | European Pat. Off. . |

OTHER PUBLICATIONS

Japanese Abstract 62–118 585 A "Light Emitting Diode Driving Device", May 29,. 1987.
Japanese Abstract 55–141768 S " Light Emitting Diode—Drive Curcuit", Nov. 5, 1980.

Primary Examiner—Don Wong
Assistant Examiner—Wilson Lee
Attorney, Agent, or Firm—Burns, Doane, Swecker & Mathis, L.L.P.

[57] ABSTRACT

A light transmitting arrangement includes a light emitting device, for example a light emitting diode and an arrangement for peaking the current through the light emitting device upon switching on and/or off. The peaking arrangement includes a peaking network which is arranged in parallel with a light emitting device and which is a passive network.

30 Claims, 2 Drawing Sheets

ARRANGEMENTS RELATING TO LIGHT EMITTING DEVICES

This application claims the foreign priority of International Application No. PCT/SE96/00574, filed May 3, 1996, which designates the United States.

FIELD OF THE INVENTION

The present invention relates to an arrangement comprising a light emitting device and an arrangement for peaking the current through the light emitting device when it is switched on and/or off.

The invention also relates to a driving circuit for switching a light emitting device on and off in response to logical data signals. This circuit comprises means for current generation and a peaking circuit. Still further the invention relates to a peaking arrangement for peaking the current upon switching optoelectronic devices on and/or off. Further still the invention relates to an optical link and to a fibre optical communication system with a number of optical links comprising light emitting devices which are on-off modulated.

BACKGROUND

Light emitting diodes (LEDs) are frequently used as light sources in optical communication systems. In such communication systems light pulses act as information carriers for digital signals. However, for example for high bit-rate communication systems the switching on/switching off of the light emitting diodes is critical in that it is not as fast as would be desired.

From an electrical point of view a light emitting diode acts as a normal semiconducting diode but the voltage drop is somewhat higher. The light emitting diode produces an optical power approximately proportional to the driving current. Light emitting diodes have been on-off modulated in a number of different ways.

One known device will now be described. The anode of the diode is connected to a positive supply voltage of for example +5 V. A current generator is arranged between ground and the cathode of the diode although in other known devices the cathode is connected to the negative supply voltage, i.e. ground. The current of the current generator is changing between two fixed levels such as for example 0 mA or somewhat higher and for example 100 mA. The current generator may e.g. be either a bipolar transistor or a MOS transistor. A current generator having an inner parallel resistance is equivalent to an ideal voltage generator having the same serial resistance. Thus another common way of driving a light emitting diode comprises a low resistance voltage generator driving the light emitting diode via a resistor. The voltage generator can e.g. be implemented as a logical inverter. If for example the inverter is a CMOS inverter fed between ground and a positive driving voltage, the light emitting diode is driven by a current charging between 0 mA and a current given by the serial resistance. However, this light emitting diode is shut off completely when it is switched off which is a drawback. Preferably a low current should flow through the diode so that the capacitance of the diode is kept in a charged state which speeds up the switching on of the light emitting diode. In order to provide for a low current through the diode even when it is switched off, an additional resistor $R_2$ is arranged as can be seen from FIG. 1. In another known device which is shown in FIG. 2 the resistor $R_1$ of FIG. 1 has been split up in two resistors $R_1'$ and $R_1''$ and a capacitor C has been connected in parallel with the resistor $R_1''$. Through the capacitor a peaking of the current through the light emitting diode is achieved. Peaking means that the current at the moment of switching on of the light emitting diode is higher than the final current. The current is also peaked when the light emitting diode is switched off so that the current typically is negative just before reaching the final value.

Generally, peaking is done since the light never follows the current exactly but the light emitting diode acts as a low pass filter from the current to the corresponding light. This means that even if the current is changed momentarily, it takes a certain time such as for example some ns before the light starts to reach its final level. Through peaking the current modulating the light emitting diode, the rise time and the fall time can be speeded up. Often active components such as transistors are used in order to achieve the peaking of the current. However, it is in practice difficult to achieve the negative current that is needed for a fast switching off of the light emitting diode since transistors are unidirectional. The devices as described above suffer a number of drawbacks. For the first, the peaking may either be too low or practically non-existing (FIG. 1) or it is not possible, as often desirable, to keep the supply current to the light emitting diode time invariable. The reason for that is that if the current is for example switched 100 mA during a time interval of for example 0.5 ns there will be a considerable transient on the supply voltage and furthermore radio frequency noise is produced. If then for example sensitive electronic circuits such as for example an optical receiver is arranged closely thereto, it could be disturbed by the radio frequency noise. This situation is even aggravated if the sensitive electronic circuit is located on the same chip since then it is not possible to filter out the noise. Therefore it has become customary to make, for a number of applications, the light emitting diode transmitters differential in order to achieve a constant feeding current. The initially discussed transmitter can easily be made differential but it does not comprise any peaking. The transmitter for which peaking can be provided as illustrated in FIG. 2 on the other hand can not be made differential. Although it would be possible to make a reversely phased identical transmitter, this is not a good solution since it is not at all sufficient to make the transmitter identical with the first one in order to obtain a constant feeding current. Among others the impedance of the light emitting diode is strongly non-linear and therefore the peaking currents upon switching on and switching off will be completely different. Moreover, in practice it is not possible to use an identical transmitter since this would require a further light emitting diode of the same kind which involves too high costs. Thus, even if the light emitting diode transmitter of FIG. 2 provides a comparatively high and well defined peaking which gives fast rise and fall times, it can not be used in applications in which a rapidly varying feeding current can not be accepted.

U.S. Pat. No. 4,818,896 shows an optical transmitter driver with current peaking. The driving circuit generates current pulses suitable for use in driving a light emitting diode at high speeds. The generated pulses contain spikes during turn-on and turn-off in order to quickly charge/discharge the junction and stray capacitances. A separate peaking circuit is provided which comprises a resistor-inductor-capacitor circuit. This peaking circuit is actively connected across the light emitting diode when peaking is required. This means that active components are required among other things in order to activate the peaking function. This arrangement consists of two differential current generators and moreover it has a large current consumption due to the two differential current generators and is too complicated to find a widespread use. It also suffers the drawback of not being flexible.

SUMMARY

It is an object of the present invention to provide an optical transmitting arrangement which comprises a light emitting device such as for example a light emitting diode and an arrangement for peaking the current through the light emitting device when the latter is switched on and off with short rise and fall times of a light pulse output. It is thus an object to provide an arrangement having a high response speed. It is also an object of the invention to provide an optical transmitting arrangement with a peaking arrangement having a high and well defined peaking. Still another object of the invention is to provide an arrangement through which both positive and negative peaking can be obtained in the same manner. It is also an object of the invention to enable a fast switching on and off of a light emitting device, i.e. to on-off modulate the light emitting device, i.e. a light emitting diode (LED) or a laser.

A particular object of the present invention is to provide a light transmitting arrangement with a light emitting device through which the supply current can be time invariable at the same time as it is provided for positive and negative peaking.

Still another particular object of the invention is to provide a peaking arrangement which is such that the peaking can easily be changed both as to its size and/or as to its duration so that the peaking arrangement or the peaking circuit easily can be adapted to different light emitting devices or particularly light emitting diodes. A particular object of the invention is to provide an arrangement through which the driving electronics of a laser transmitter can be converted into a light emitting diode transmitter with peaking.

A further aspect of the invention relates to an optical link comprising a transmitting arrangement with light emitting devices (e.g. diodes) and peaking arrangements fulfilling one or more of the objects as referred to above. According to still a further aspect it is an object to provide an optical communication system comprising such arrangements and fulfilling one or more of the above mentioned objects.

Another particular object of the invention is to provide a light emitting device and a peaking arrangement which can be encapsulated within one and the same package e.g. provided in the form of module.

Therefore a light transmitting arrangement comprising a light emitting device and an arrangement for peaking is provided wherein the peaking arrangement comprises a peaking circuit or network which is arranged in parallel with the light emitting device and wherein further the peaking curcuit or the peaking network is a passive network.

Further, a peaking arrangement is provided for peaking the current on/off modulating light emitting devices which comprises passive components and which is to be arranged in parallel with the light emitting device.

Particularly the peaking network comprises a capacitor, a resistor and an inductor connected in series and a positive peaking is provided when the light emitting device is switched on and a negative peaking is provided when it is switched off. In a particular embodiment enclosing means or encapsulating means are provided thus encapsulating the light emitting device or particularly the light emitting diode. The peaking arrangement may be arranged externally of the capsule but according to an alternate embodiment the peaking arrangement is arranged internally within the same package as the light emitting device (e.g. diode). Advantageously passive miniature components are used for the peaking circuit. In another advantageous embodiment the resistor, which gives the amount of peaking, is variable and thus the peaking can be controlled through variation of the resistor. Still more advantageously the duration of the peaking, which is given by the inductor, can be controlled by varying the inductance.

Particularly a driving arrangement comprising current generating means is provided. The current generating means may e.g. consist of a current generator for example comprising a bipolar transistor or a MOS-transistor. Particularly the current generator is such that a constant supply current is provided and it may particularly comprise a differential current generator. In a particular embodiment a positive peaking current is generated in response to a logic "1" input data signal whereas a negative peaking current is generated in response to a logic "0" input signal, but it can also be e.g. the other way round. In an alternative embodiment a voltage generator and a resistor connected in series form the current generating means. In an advantageous embodiment the capacitance is between 0.1 and 10 $\mu$F. However, the invention is of course not limited to embodiments wherein the capacitance falls between these limits, other values are of course possible; these have merely been given for exemplifying reasons. From a technical point of view there is no upper limit restriction for the capacitance, it is in practice merely limited by the physical size and generally it is desirable to avoid it being too large. Particularly the capacitance of the capacitor is so high that it can be said to more or less act as a short-circuit for the frequencies which in most cases are used.

According to one aspect of the invention a peaking arrangement is given wherein the peaking circuit comprises passive components which provide a positive and a negative peaking when the state of an optical device which is switched on/off by a current, is changed.

The invention also relates to an optical driving circuit for switching a light emitting device on and off in response to logical data signals which comprises current generating means and wherein a peaking circuit produces a positive peaking when a light emitting device is switched on and which provides a negative peaking when the light emitting device is switched off by the driving arrangement and wherein the peaking arrangement comprises a passive circuit.

The invention also provides for an optical link which comprises an optical transmitting arrangement as discussed above and an optical communication system comprising such optical transmitting arrangement or light emitting devices. In another aspect the invention provides for an exchange comprising fast optical links comprising optical transmitting arrangement or light emitting devices which may be encapsulated or not wherein peaking arrangements or peaking circuits are arranged within the capsule encapsulating the light emitting diodes. Alternatively they may be arranged externally of the package.

BRIEF DESCRIPTION OF THE DRAWINGS

The invention will in the following be further described in a non-limiting way under reference to the accompanying drawings in which.

DETAILED DESCRIPTION

Figure 1:
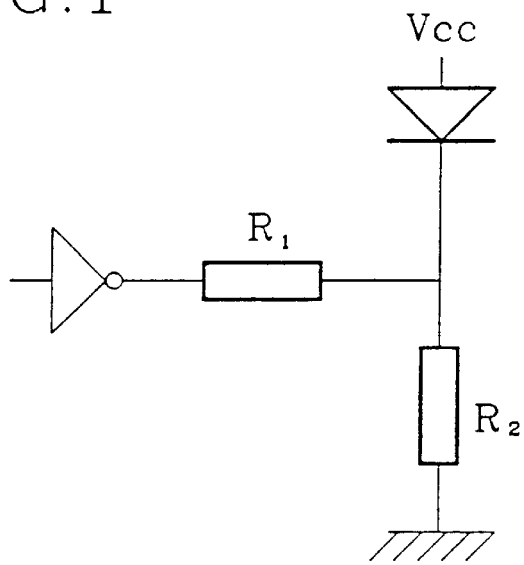
FIG. 1 illustrates a known arrangement for driving a light emitting diode.
Figure 2:
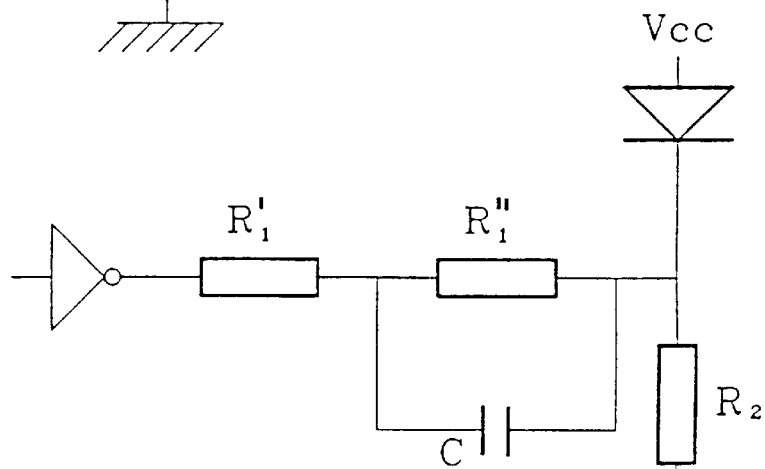
FIG. 2 illustrates another known device for driving a light emitting diode.
Figure 3:
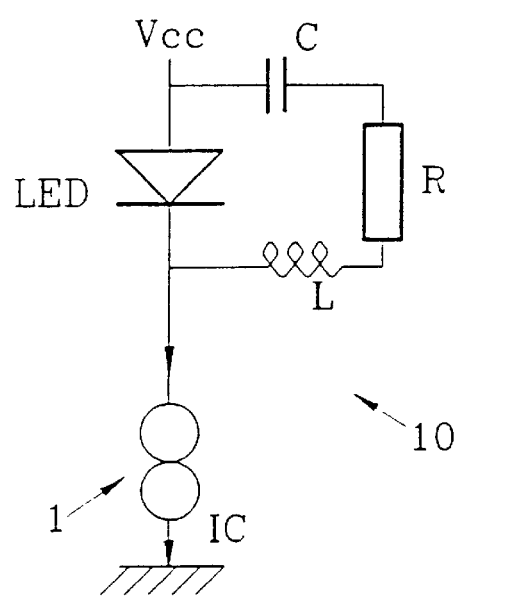
FIG. 3 illustrates a first embodiment of a light transmitting arrangement according to the invention.

FIG. 3 illustrates a light transmitting arrangement 10 according to a first embodiment of the invention. The anode of a light emitting diode LED is connected to a positive supply voltage $V_{CC}$ and a current generator 1 is arranged between the cathode of the light emitting diode and ground. According to an alternative embodiment, it is of course possible to instead connect the cathode of the light emitting diode LED to the negative feeding voltage, i.e. ground.

The current from the current generator 1 varies between two fixed levels $I_0$ and $I_1$. According to a particular embodiment I can be 0 mA or somewhat higher and $I_1$ can for example be 100 mA. The current generator can for example be a bipolar transistor, alternatively it can be a MOS-transistor. However, also other alternatives are possible.

Since a current generator having an inner parallel resistance is completely equivalent to an ideal voltage generator with a serial resistance of the same size, it is also possible to use such a device to drive the light emitting diode (this embodiment is not illustrated here).

Figure 5:
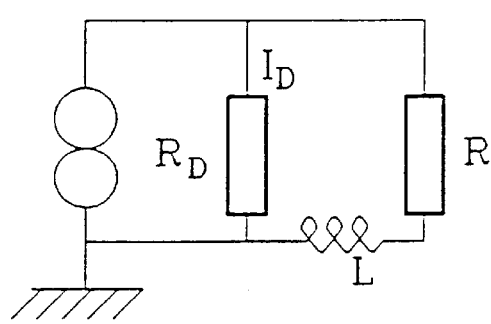

A peaking network is arranged in parallel with the light emitting diode LED. The peaking circuit comprises a capacitor C, a resistor R and an inductor L which are connected in series. Through this peaking network the current through the light emitting diode LED is peaked and the peaking is negative when the current is switched off. In order to explain how the peaking is achieved, an analysis in frequency domain is given. A simple linear model of the impedance of the light emitting diode is needed. For a high current, the impedance of the light emitting diode can as a first approximation be seen as a constant resistance having a value of for example 5 Ω. Furthermore it is supposed that the capacitor is large and that it has as its only task to block the DC current. If a high frequency analysis is done, the capacitor can therefore be approximated by a short circuit. This gives a simplified signal model of the light emitting diode transmitter which is illustrated in FIG. 3. This simplified model is illustrated in FIG. 5. A current generator provides the current I and it is intended to calculate the transfer function from I to $I_D$ which represents the current through the light emitting diode. $R_D$ represents the resistance of the light emitting diode and R and L are the same as in FIG. 5. This gives that $$H(s) = \frac{I_D(s)}{I(s)} = \frac{s + \frac{R}{L}}{s + \frac{R_D + R}{L}}$$

The transfer function H(s) (s is the Laplace operator) is a typical example of so called peaking. A zero breaks up the transfer function at the frequency $R/2\pi L$ and a pole breaks back the transfer function at the frequency $(R_D+R)/2\pi L$. To obtain the amount of peaking, the value of the transfer function for low frequencies can be calculated by setting s=0 which gives:

$$H(0) = \frac{R}{R_D + R} < 1$$

For high frequencies, i.e. when the Laplace operator s is large, the transfer function can be approximated as $$H(s)=1$$

It can be seen that the high frequency currents only pass through the light emitting diode whereas the low frequency currents also pass through the network connected in parallel.

If the current from the current generator, I, varies between 0 and $I_1$ and since the capacitor C blocks the DC current it can be shown that:

$$I_L = \frac{R_D}{2(R_D + R)} I_1$$

$$I_H = \left(1 - \frac{R_D}{2(R_D + R)}\right) I_1$$

$$I_{LPeak} = -\frac{R_D}{2(R_D + R)} I_1$$

$$I_{HPeak} = \left(1 + \frac{R_D}{2(R_D + R)}\right) I_1$$

$$I_{HPeak} - I_{LPeak} = \left(1 + \frac{R_D}{R_D + R}\right) I_1$$

wherein $I_L$=a stationary lower current when the peaking has faded out, $I_H$=a stationary higher current when the peaking has faded out, $I_{Lpeak}$=a momentary low current at the beginning of the negative peaking (I=0), $I_{Hpeak}$=a momentary high current at the beginning of the positive peaking (I=$I_1$).

The above expressions are somewhat approximate since they rely on certain idealized relationships such as that the rise and fall time respectively for the current I are infinitely fast and that the peaking has completely faded out before the current I changes value.

Moreover the definition of the dynamical resistance $R_D$ of the light emitting diode is not completely obvious since the relationship between current and voltage for the light emitting diode is non-linear. If it is supposed that the duration of the peaking is short it is always possible to calculate $R_D$ for a given diode curve, i.e. the current as a function of the voltage or the other way round, since for the correct value of $R_D$:

$$R_D = \frac{U(I_H) - U(I_L)}{I_H - I_L}$$

$R_D$ can for example be calculated through iteration in a manner known per se. Both $I_H$ and $I_L$ depend on $R_D$ which can be seen from the above formulas and it is also supposed that the relationship U(I) is well known for the light emitting diode in question.

The duration of the peaking can be expressed as the time constant τ of the peaking. The first of the above mentioned formulas give that the time constant for the peaking is:

$$\tau = \frac{L}{R_D + R}$$

It is well known that the differential resistance of the light emitting diode varies with the current of the light emitting diode. Thus $R_D$ in the expression for the time constant merely approximatively corresponds to the expression for $R_D$ given above. This means that the time constant may get a somewhat shorter duration when the light emitting diode is switched off. It is moreover known that $I_{Lpeak}$ is negative which means that $R_D$ is very high, i.e. the time constant is very short. However, this is not always the case since a real light emitting diode always has a parallel capacitance and the negative current through the diode, at least at the beginning, only goes through the capacitance while the voltage of the light emitting diode still is positive and therefore the resistance $R_D$ is not extremely high.

In order to illustrate the above mentioned, a numerical example is given. It is supposed that $I_1$=100 mA, $R_D$=5 Ω, R=15 Ω, L=100 nH This gives that $I_L$=12.5 mA, $I_H$=87.5 mA, $I_{Lpeak}$=−12.5 mA, $I_{Hpeak}$=112.5 mA, $I_{Hpeak}$−$I_{Lpeak}$=125 mA and τ=5 ns.

It should be noted that the peak-to-peak current, $I_{Hpeak}$−$I_{Lpeak}$ is higher than the original current $I_1$.

Figure 4:
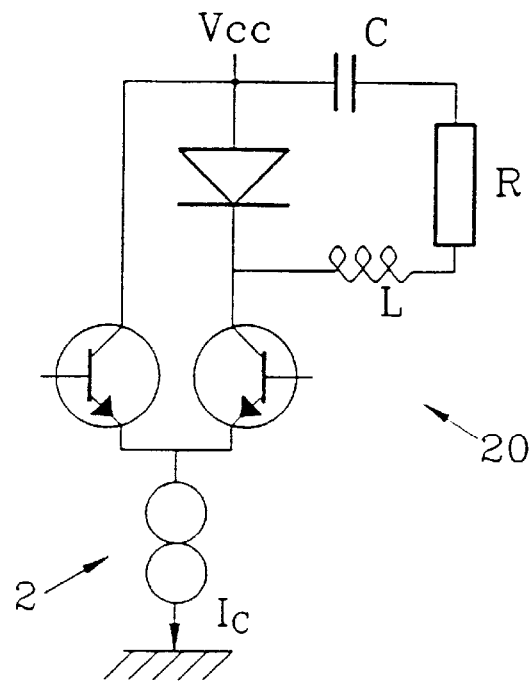
FIG. 4 illustrates a differentional transmitting arrangement according to the invention, FIG. 5 schematically illustrates a simplified signal model of the light light transmitting arrangement according to FIG. 3 and, FIG. 6 shows an optical arrangement comprising a light emitting device and a peaking circuit.

FIG. 4 illustrates a further arrangement 20 of the invention wherein a differential current generator is used. The reference signs remain the same as in FIG. 3. With this solution, a constant supply current is generated at the same time as a current peaking is available. The current $I_C$ is a constant current which is switched between the two branches of the differential arrangement.

According to another embodiment, a laser transmitting arrangement can be converted into a light emitting diode transmitting arrangement with peaking. Since the peaking circuit is passive, this can be done on an already existing arrangement.

Figure 6:
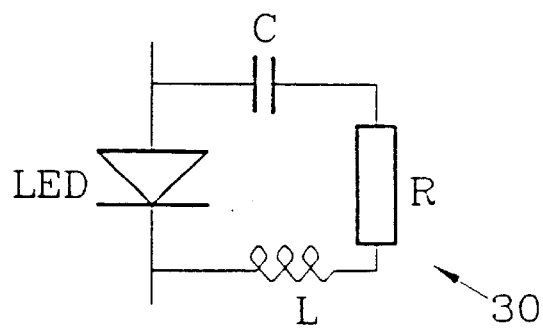

FIG. 6 illustrates a light emitting arrangement 30 comprising a light emitting device LED and a peaking circuit connected in parallel therewith. The peaking circuit is the same as the one described in relation to FIG. 3.

According to one advantageous embodiment a light emitting diode is encapsulated in a package and the parallel peaking network is arranged outside the package. However, according to another advantageous embodiment miniature components are used for the peaking network. Then the network can be arranged within the same package as the light emitting diode. An advantage of that is that the network is placed within the stray inductance of the package which further improves the peaking. This furthermore enables the preparation of peaking networks suitable for particular light emitting diodes, i.e. for each light emitting diode a network can be fabricated which perfectly suits the diode.

Generally, the current may vary between 0 and $I_1$. This implicitly means that the current for the above mentioned embodiments may go from $I_0$ and $I_1$ wherein $I_0$ can be greater than 0. If $I_0$ is greater than 0, the capacitance of the light emitting diode is charged which facilitates a fast switching on.

Generally the data flow i.e. logical "1", "0" at least to some extent has to be coded or balanced, (DC- balanced), i.e. the number of first and second logical signs (e.g. "1", "0") has to be more or less the same. This is however the case for most to-date systems.

According to further embodiments of the invention devices as described above are arranged as optical sources in optical communication systems or in optical links used in optical communication systems. Particularly optical devices as described above can be used as optical links transmitting the information internally within a switching equipment of a telecommunication system.

What is claimed is:

1. Light transmitting arrangement comprising a light emitting device and an arrangement for peaking a current through the light emitting device when it is switched on and off, wherein the peaking arrangement comprises a peaking network arranged in parallel with the light emitting device, the peaking network is a passive network, and the peaking current can be either positive or negative.

2. Light transmitting arrangement according to claim 1, wherein the peaking network comprises a capacitor, resistor and an inductor connected in series.

3. Light transmitting arrangement according to claim 1, wherein a positive peaking is provided when the light emitting device is switched on and a negative peaking is provided when the light emitting device is switched off.

4. Light transmitting arrangement according to claim 1, wherein enclosing means are provided and the light emitting device is arranged within the enclosing means.

5. Light transmitting arrangement according to claim 4, wherein the peaking arrangement is arranged externally of the enclosing arrangement.

6. Light transmitting arrangement according to claim 4, wherein both the light emitting device and the peaking arrangement comprising the peaking network are arranged within the enclosing means.

7. Light transmitting arrangement according to claim 4, wherein the enclosing means is a package.

8. Light transmitting arrangement according to claim 6, wherein passive miniature components are used for the the peaking circuit.

9. Light transmitting arrangement according to claim 2, wherein the amount of peaking is given by the resistance of the resistor.

10. Light transmitting arrangement according to claim 9, wherein the resistor is variable and through varying the resistor the amount of peaking can be controlled.

11. Light transmitting arrangement according to claim 2, wherein the duration of the peaking is given by the inductor the inductance of which is chosen so that a desired duration of peaking is obtained.

12. Light transmitting arrangement according to claim 1, wherein the peaking arrangement is included in a driving arrangement for switching the light emitting device on and off.

13. Arrangement according to claim 12, wherein the driving arrangement comprises current generating means.

14. Arrangement according to claim 13, wherein the current generating means comprises a current generator.

15. Arrangement according to claim 14, wherein the current generating means comprises a bipolar transistor.

16. Arrangement according to claim 14, wherein the current generating means comprises a MOS-transistor.

17. Arrangement according to claim 14, wherein a substantially constant supply current is provided by the current generating means.

18. Arrangement according to claim 17, wherein the current generating means comprises a differential current generator.

19. Arrangement according claim 13, wherein a voltage generator and a resistor connected in series form the current generating means.

20. Arrangement according to claim 1, wherein in response to input data signals, a positive peaking current is generated in response to a first logical signal and a negative peaking current is generated in response to a second logical input signal.

21. Arrangement according to claim 2, wherein the capacitance is between 0.1–10 $\mu F$.

22. Arrangement according to claim 2, wherein the capacitance value is so high that the capacitor substantially acts as a short-circuit for the used frequencies.

23. Electrical driving network for switching a light emitting device on and off in response to logic data signals comprising current generating means and a peaking circuit which produces a positive peaking when the light emitting device wherein the peaking arrangement comprises a passive circuit and a negative peaking is provided when the light emitting device is switched off by the driving arrangement.

24. Network according to claim 23, wherein the peaking arrangement comprises a resistor, capacitor and an inductor connected in series and the peaking arrangement is connected in parallel with the light emitting device.

25. Peaking arrangement for peaking a current upon switching a light emitting device on and/or off comprising a peaking circuit, wherein the peaking circuit comprises passive components providing a positive and a negative peaking upon changes in a state of the light emitting device responsive to switching on and off respectively.

26. Arrangement according to claim 25, comprises a resistor (R), a capacitor (C) and an inductor in that connected in series and in is to be connected in parallel with a light emitting device such.

27. Arrangement according to claim 26, wherein the peaking circuit is arranged on a module which can be connected to a light emitting device.

28. Optoelectronic module comprising a light emitting device and a current peaking circuit, wherein the current peaking circuit is made by passive components, is connected in parallel with the light emitting device, and is arranged for peaking a current, either positive or negative, through the light emitting device.

29. Optical module according to claim 28, wherein both the light emitting device and the passive peaking circuit are arranged within a package which is common to both.

30. Optical link for transmission of information comprising transmitting arrangements each with a light emitting device and a peaking arrangement for peaking the current through the light emitting device, wherein at least one peaking arrangement comprises a passive network arranged in parallel with a light emitting device to enable a fast switching on/off of the light emitting device.

* * * * *